United States Patent [19]

Wilson et al.

[11] 4,335,254
[45] Jun. 15, 1982

[54] POLYMERIZABLE ACRYLOYLOXYARYLENESULFONAMIDES

[75] Inventors: John C. Wilson; Paul D. Yacobucci, both of Rochester, N.Y.

[73] Assignee: Eastman Kodak Company, Rochester, N.Y.

[21] Appl. No.: 268,547

[22] Filed: May 29, 1981

Related U.S. Application Data

[62] Division of Ser. No. 22,406, Mar. 21, 1979, Pat. No. 4,289,865.

[51] Int. Cl.³ ............... C07C 69/54; C07C 69/653
[52] U.S. Cl. ............................. 560/138; 560/139; 560/140; 560/141; 560/142
[58] Field of Search ............... 560/142, 138, 139, 140, 560/141

[56] References Cited

U.S. PATENT DOCUMENTS 4,074,059 2/1978 Bullock et al. ............... 560/142

Primary Examiner—Natalie Trousof
Assistant Examiner—Frederick W. Pepper
Attorney, Agent, or Firm—Arthur H. Rosenstein

[57] ABSTRACT

Disclosed herein are monomeric compounds having the formula:

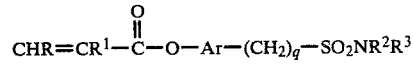

wherein:
R and $R^1$ are independently hydrogen, halide or alkyl;
$R^2$ and $R^3$ are independently hydrogen, alkyl, cycloalkyl, aryl or aralkyl;
q is 0 or 1; and
Ar is arylene wherein no more than one of $R^2$ and $R^3$ is hydrogen, and a method of preparing same.

These monomers can be homopolymerized or copolymerized with one or more other monomers to yield polymers having desirable solubility characteristics. In particular, copolymerizable ethylenically unsaturated monomers can comprise aldehyde-containing vinylaryl ethers to yield crosslinkable polymers useful in relief image materials or as binders in photographic layers.

3 Claims, No Drawings

POLYMERIZABLE ACRYLOYLOXYARYLENESULFONAMIDES

This is a division of application Ser. No. 022,406, filed Mar. 21, 1979 now U.S. Pat. No. 4,289,865.

BACKGROUND OF THE INVENTION

1. Field of the Invention

This invention relates to organic materials which are useful in preparing polymers particularly useful in the graphic arts and photographic arts fields. In one of its aspects, it relates to the use of such materials to prepare polymers which can be incorporated into radiation-sensitive elements to obtain a desirable combination of properties. In another of its aspects, it relates to the preparation of such organic materials.

2. Description of the Prior Art

The formation of ethylenically unsaturated monomers by reacting an acyl halide material with a substituted phenol is known. For instance, Naito et al, *Mokuzai Gakkaishi*, 22 (8), 1976, pages 461 through 465, discloses a reaction of o-methoxyphenol with poly(methacryloyl chloride) to form poly(o-methoxyphenyl methacrylate). U.S. Pat. No. 3,024,221, issued Mar. 6, 1962, discloses the reaction of a vinyl acyl halide with a sulfonic acid substituted phenol.

U.S. Pat. No. 2,566,162, issued Aug. 28, 1961, discloses vinyl sulfonilimide monomers formed by reacting a sulfonilimide with an acrylyl or methacrylyl halide in a basic environment. However, these polymers are not soluble in acetone, which is the preferred solvent for coating polymeric binders for radiation-sensitive elements.

It would be highly desirable to have available vinyl ester monomers with pendant arylenesulfonamide groups which are soluble in acetone. It would also be desirable to have available a method of incorporating such pendant groups into polymers.

SUMMARY OF THE INVENTION

The present invention provides polymerizable vinyl arylenesulfonamide esters which are soluble in acetone, methyl ethyl ketone, tetrahydrofuran and dioxane, and are easily prepared from readily available starting materials. The present invention also provides polymers containing pendant arylsulfonamide groups formed from such monomers.

The polymers of the present invention are useful in many applications, but are particularly useful as copolymers in radiation-sensitive materials used in the graphic arts. Such copolymers which can also comprise units of polymerized vinyl ethers having pendant aldehyde groups can crosslinked with reagents, such as amines, to provide organic solvent insoluble areas. These insoluble areas in light-exposed regions of a lithographic plate or photoresist provide negative relief images. Preferred uses for the polymers of this invention are disclosed in U.S. Pat. No. 4,239,848, issued Dec. 16, 1980.

Certain other copolymers can comprise units of polymerized ethylenically unsaturated monomers having ionic groups which form copolymers soluble in solvent systems, such as acetone-water mixtures, water, methanol, alcohol-water mixtures and the like. Such anionic or cationic copolymers are suitable for aqueous processing.

The polymers of the present invention are also useful as binder vehicles in a variety of applications, such as in various light-sensitive compositions, subbing layers and the like.

One aspect of the present invention comprises a compound having the formula:

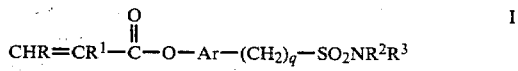

wherein:

R and $R^1$ are independently hydrogen, halide or alkyl;

$R^2$ and $R^3$ are independently hydrogen, alkyl, cycloalkyl, aryl or aralkyl, but no more than one of $R^2$ and $R^3$ can be hydrogen;

q is 0 or 1; and

Ar is arylene.

In another aspect of the present invention, a process of preparing the compounds of formula (I) comprises reacting a compound having the formula:

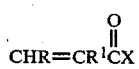

with a compound having the formula:

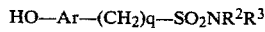

in an organic solvent medium wherein R, $R^1$, $R^2$, $R^3$, q, and Ar are as defined above, and X is a halide.

Still another aspect of the present invention comprises a polymer formed from: (a) about 1 to about 100 mole percent of one or more monomers having formula (I), and (b) from 0 to about 99 mole percent of one or more additionally ethylenically unsaturated polymerizable monomers.

In still another aspect of the present invention, a process of preparing the above-described polymer comprises (1) reacting a vinyl acyl halide having the formula:

with a hydroxy compound having the formula:

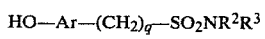

in an organic solvent medium wherein R, $R^1$, $R^2$, $R^3$, Ar, q and X are as defined above, and (2) polymerizing the monomer formed in step (1) with 0 to 99 mole percent of one or more additional ethylenically unsaturated polymerizable monomers.

DETAILED DESCRIPTION OF THE INVENTION

The monomers of the present invention are depicted by the formula:

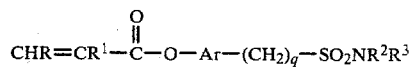

wherein:

R and $R^1$ are independently hydrogen; halide, such as fluoride, chloride, bromide and iodide; or alkyl, preferably having from 1 to 4 carbon atoms, such as methyl, ethyl, propyl, isopropyl, tert-butyl and the like, including substituted alkyls, such as haloalkyls, such as chloromethyl, 1,2-dibromoethyl and the like;

$R^2$ and $R^3$ are independently hydrogen, but only one of $R^2$ and $R^3$ can be hydrogen; alkyl, preferably having from 1 to 10 carbon atoms, such as methyl, ethyl, n-butyl, tert-butyl, hexyl, 2,3-dimethyloctyl and the like, including substituted alkyls such as described above; cycloalkyl, preferably having 4 to 10 carbon atoms, such as cyclobutyl, cyclopentyl, cyclohexyl, 1,3-dimethylcyclooctyl and the like, and substituted cycloalkyls having substituents such as those listed for the alkyl groups described above; or aryl, preferably having 6 to 18 carbon atoms, including phenyl, naphthyl, anthryl and aryl groups substituted with substituents such as alkyl, halides, nitro, alkoxy and the substituents as described for the above alkyl groups; or aralkyl, preferably having from about 7 to 20 carbon atoms, including benzyl, methylbenzyl, diphenylmethyl and chlorobenzyl;

Ar is arylene, preferably having from 6 to 18 carbon atoms, including phenylene, naphthylene, phenylenedimethylene, diphenylene and the like which can be substituted or unsubstituted, for example, with alkyl, preferably containing 1 to 4 carbon atoms, halide, sulfonamido, nitro, alkoxy and the like substituted groups as described above; and q is 0 or 1.

Exemplary monomers corresponding to formula (I) include N-butyl-4-methacryloyloxybenzenesulfonamide, N-phenyl-4-methacryloyloxybenzenesulfonamide, N-cyclohexyl-4-acryloyloxybenzenesulfonamide, N,N-dimethyl-4-methacryloyloxy-1-naphthylenesulfonamide, 4-α-chloromethacryloyloxybenzenesulfonamide and the like.

Preferred monomers of the present invention are those of formula (I) wherein R and $R^2$ are hydrogen, $R^1$ is hydrogen or methyl, $R^3$ is alkyl or aryl, and Ar is phenylene. Particularly preferred monomers are N-butyl-4-methacryloyloxybenzenesulfonamide and N-methyl-4-methacryloyloxybenzenesulfonamide.

The process of preparing monomers of formula (I) comprises reacting a vinyl acyl halide compound having the formula:

with a hydroxy compound having the formula:

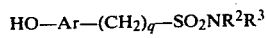

in an organic solvent medium. R, $R^1$, $R^2$, $R^3$, Ar, q and X are as defined above.

Typical vinyl acyl halides include methacryloyl chloride, methacryloyl bromide, acryloyl chloride, ethacryloyl chloride, α-chloroacryloyl chloride and the like. It is noted that many other halides could be used to prepare the monomers described hereinabove.

Similarly, typical hydroxy compounds useful herein include substituted or unsubstituted N-alkyl-4-hydroxybenzenesulfonamides, hydroxynaphthylenesulfonamides, and the like. The sulfonamides can be prepared from readily available materials according to methods well known in the art, such as described in Wagner et al, *J. Med. Chem.*, 8(3), 377 (1965), and U.S. Pat. No. 2,929,710.

The described reactants are reacted in the presence of an acid acceptor which is defined as a compound which will react with the released halo acid condensate to form a salt and aid in shifting equilibrium to product. Exemplary acid acceptors include hydroxides, such as alkali metal hydroxides, alkaline earth metal hydroxides, quaternary alkyl ammonium hydroxides and the like; alkoxides, such as aluminum butoxide, calcium isopropoxide, sodium ethoxide and the like; carbonates, such as sodium carbonate, potassium carbonate, calcium carbonate and the like; trialkylamines, such as triethylamine, tributylamine and the like; pyridine; picoline; lutidine; weak base ion-exchange resins, such as Amberlite IR4B and Amberlite IR-45 (products sold commercially by Rohm and Haas Company) and the like; and others well known in the art. The acid acceptors are generally present in the reaction mixture in ratios of 1:1 to 2.2:1.0 with the hydroxy compound.

Stoichiometrically, one mole of each of the reactants is required to produce one mole of monomer and one mole of salt byproduct. Actually, it may be desired to provide an excess of the vinyl acyl halide compound. Suitable molar ratios of the halide to the hydroxy compound can be between about 2:1 and about 1:1, and preferably between about 1.2:1.0 and about 1.0:1.0.

If desired, a mutual inert solvent can be employed to dissolve the reactants or serve as a heat transfer medium. The use of inert solvents is particularly desirable in a continuous method of preparation. The products can be removed from the reaction solvent by any suitable means such as filtration, recrystallization and the like. The amount of solvent is not critical and can vary between about 75 and about 99 weight percent of the reaction mixture, with between about 83 and about 93 weight percent being preferred. Suitable solvents include chlorinated solvents, such as methylene chloride, ethylene chloride and the like; diethyl ether; tetrahydrofuran and the like.

The reaction generally proceeds at a temperature between about $-10°$ and $10°$ C., and preferably between about $-5°$ to about $0°$ C. The reaction pressure can be from subatmospheric to superatmospheric pressures of 1,000 psig or higher. Typically, the reaction is carried out at atmospheric pressure.

The reaction time is a function of reaction temperature, pressure and the particular reactants employed. In general, reaction times are between about 0.5 and about 4 hours, but shorter times can be employed with more active reactants and longer times for less active reactants.

Particular reaction conditions are illustrated in examples below in the preparation of particular monomers.

The sulfonamide-containing monomers described herein are useful in making the acetone-soluble polymers of the present invention.

The polymers comprise about 1 to 100 mole percent of one or more polymerized monomers of the described formula (I). Mixtures of such monomers can be used, if desired, in forming the polymers.

The copolymers can comprise up to 99 mole percent of recurring units derived from one or more additional ethylenically unsaturated polymerizable monomers, each containing, for example, at least one $-CH=C<$ or $CH_2=C<$ group. Exemplary monomers include, for example, vinyl esters, such as vinyl acetate, vinyl butyrate and the like; vinyl amides, such as acrylamide, methacrylamide, N-methacrylamide, N-isopropylacrylamide and the like; vinyl nitriles such as acrylonitrile, methacrylonitrile, 3-butenenitrile and the like;

vinyl ketones, such as methyl vinyl ketone and the like; vinyl halides, such as vinyl chloride, vinyl bromide, vinylidene chloride and the like; vinyl ethers, such as allyl phenyl ether, methyl vinyl ether and o-formylphenyl vinylbenzyl ether; α,β-unsaturated acids or esters thereof, such as acrylic acid, methacrylic acid, methyl acrylate, butyl methacrylate, 2-dimethylaminoethyl methacrylate, 2-ethylhexyl acrylate, 2-hydroxyethyl methacrylate, m-formylphenyl methacrylate and the like; olefins and diolefins, such as ethylene, propylene, butadiene, isoprene, 1,1-di-phenylethylene and the like; vinyl aromatics, such as styrene, α-methylstyrene, p-chlorostyrene and the like; 4,4,9-trimethyl-8-oxo-7-oxa-4-azonia-9-decene-1-sulfonate; 2-(methacryloyloxy)ethyltrimethylammonium methosulfate; N-vinylsuccinimide; N-vinylphthalimide; N-vinylpyrazolidone and the like. Mixtures of monomers can be used, if desired.

In one preferred embodiment of the present invention, novel uncrosslinked polymers which are soluble in acetone, tetrahydrofuran and methyl ethyl ketone and the like, are formed from:

(a) about 1 to about 99 mole percent of one or more monomers having formula (I); and (b) about 1 to about 99 mole percent of one or more additional ethylenically unsaturated polymerizable monomers containing pendant aldehyde groups which crosslink with reagents, such as amines.

Exemplary of such aldehyde-containing monomers include m-formylphenyl methacrylate, m-formylphenyl acrylate, acrylamidoacetaldehyde, p-(2-methacryloyloxyethoxy)benzaldehyde and the like, as described in U.S. Pat. No. 2,929,710, which is incorporated herein by reference; and monomers having the formula (II):

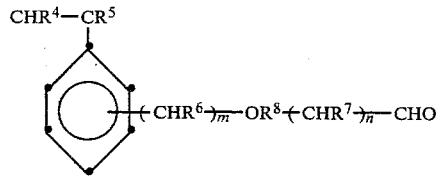

wherein:

$R^4$, $R^5$, $R^6$ and $R^7$ are independently hydrogen or alkyl having from 1 to 4 carbon atoms, such as methyl, ethyl, propyl, butyl, isopropyl, tert-butyl and the like.

$R^8$ is arylene having from 6 to 18 carbon atoms, such as phenylene, naphthylene, anthrylene, biphenylylene, including arylenes substituted with any of the above substituents;

m is an integer of from 1 to 4; and n is an integer of from 0 to 4.

Exemplary monomers corresponding to formula (II) include o-, p- or m-formylphenyl vinylbenzyl ether; o-, p- or m-(2-formylethoxy)phenyl vinylbenzyl ether; 2-, 3- or 4-formylnaphthyl vinylbenzyl ether o-, p- or m-formylbiphenylyl vinylbenzyl ether; o- or p-formyl-2-methylphenyl vinylbenzyl ether and the like. Mixtures of these monomers can be used, if desired.

Preferred polymers of the present invention formed from monomers having formula (II) are those wherein $R^4$, $R^5$, $R^6$ and $R^7$ are all hydrogen, and most preferably when, additionally, m is 1 and n is 0. Particularly preferred polymers are obtained when $R^8$ is phenylene, including such monomers as o-, p- or m-formylphenyl vinylbenzyl ether.

Methods of preparing monomers of formula (II) are discussed in U.S. Pat. No. 4,225,689, issued Sept. 30, 1980.

In another embodiment, novel copolymers soluble in acetone-water, methanol, methanol-water and water solvent systems when used in minor amounts are suitable for aqueous coating and processing. These copolymers can be formed from:

(a) about 1 to about 99 mole percent of one or more monomers having formula (I); and (b) about 1 to about 99 weight percent of one or more additional ethylenically unsaturated polymerizable monomers having ionic groups.

Exemplary copolymerizable monomers include the following and/or their salts:

N-(2-methacryloyloxyethyl)-N,N,N-trimethylammonium methosulfate
N-benzyl-N,N-dimethyl-N-vinylbenzylammonium chloride
Aconitic acid
2-Acrylamido-2-methylpropanesulfonic acid
3-Acrylamidopropane-1-sulfonic acid
Acrylic acid
Methacrylic acid
4-Acryloyloxybutane-1-sulfonic acid
3-Acryloyloxypropionic acid
3-Acryloyloxybutane-1-sulfonic acid
3-Acryloyloxypropane-1-sulfonic acid
4-t-Butyl-9-methyl-8-oxo-7-oxa-4-aza-9-decene-1-sulfonic acid
α-Chloroacrylic acid
Maleic acid
Chloromaleic acid
2-Methacryloyloxyethyl-1-sulfonic acid
Citraconic acid
Crotonic acid
Fumaric acid
Mesaconic acid
α-Methyleneglutaric acid
Monoethyl fumarate
Monomethyl α-methyleneglutarate
Monomethyl fumarate
Vinylsulfonic acid
p-Styrenesulfonic acid
4-Vinylbenzylsulfonic acid
Acryloyloxymethylsulfonic acid
4-Methacryloyloxybutane-1-sulfonic acid
2-Methacryloyloxyethane-1-sulfonic acid
3-Methacryloyloxypropane-1-sulfonic acid
2-Acrylamidopropane-1-sulfonic acid
2-Methacrylamido-2-methylpropane-1-sulfonic acid
3-Acrylamido-3-methylbutane-1-sulfonic acid; and
Maleic anhydride The preferred monomer having an ionic group is N-(2-methacryloyloxy)ethyltrimethylammonium methosulfate.

Although the amount of polymerized monomer of formula (I) incorporated in the polymers of the present invention can vary from about 1 to about 100 mole percent, preferably the amount is from about 50 to about 99 mole percent. The preferred amount of additional ethylenically unsaturated polymerizable monomers is from about 0 to about 50 mole percent.

Exemplary polymers of the present invention include poly(N-butyl-4-methacryloyloxybenzenesulfonamide), poly(N-phenyl-4-methacryloyloxybenzenesulfonamide), poly(N-cyclohexyl-4-acryloyloxybenzenesulfonamide), poly(N,N-dimethyl-4-methacryloyloxy-1- naphthylenesulfonamide), poly(N-butyl-4-methacryloyloxybenzenesulfonamide-co-o-formylphenyl vinylbenzyl ether), poly(N-phenyl-4-methacryloyloxybenzenesulfonamide-co-m-formylphenyl methacrylate) and the like.

The process of preparing the polymers of the present invention comprises two steps, the first being that of making sulfonamide monomers by the method described earlier. The second step comprises homopolymerization of these monomers or copolymerization with each other, or with the additional ethylenically unsaturated polymerizable monomers.

Polymerization can be carried out using techniques available to those skilled in the polymer chemistry art, including bulk, suspension, emulsion, solution and continuous techniques. Preferably, it is carried out in organic solvent solutions, usually solvents such as p-dioxane, N,N-dimethylformamide, tetrahydrofuran and the like, and most preferably in p-dioxane.

The temperature at which the polymers of the present invention are prepared is subject to wide variation, since this temperature depends upon such variable features as the specific monomers used, duration of heating, pressure employed and like considerations. However, the polymerization temperature generally does not exceed about 110° C., and most often it is in the range of about 40° to about 100° C. The polymerization can be carried out in a suitable vehicle, for example, water or mixtures of water with water-miscible solvents, as exemplified by methanol, ethanol, propanol, isopropyl alcohol, butyl alcohol, and the like when emulsion or suspension techniques are used. The pressure employed in the polymerization, if any, is usually only sufficient to maintain the reaction mixture in liquid form, although either superatmospheric or subatmospheric pressures can be used. The concentration of polymerizable monomer in the polymerization mixture can be varied widely with concentrations of up to about 80 percent by weight, and preferably from about 10 to about 50 percent by weight, based on the weight of the vehicle, being satisfactory. Suitable catalysts for the polymerization reaction include, for example, from about 0.001 to about 2.0 weight percent of free radical catalysts, such as hydrogen peroxide, cumene hydroperoxide, azo-type initiators and the like. In redox polymerization systems, conventional ingredients can be employed. If desired, the polymer can be isolated from the reaction vehicle by freezing, salting out, precipitation in a non-solvent, such as diethyl ether, or any other procedure suitable for this purpose.

As indicated in U.S. Pat. No. 3,142,568, issued July 28, 1964, it is sometimes advantageous to include a surface active agent or compatible mixtures of such agents in emulsion or suspension preparation of vinyl or addition polymers. Suitable wetting agents include the non-ionic, ionic and amphoteric types, as exemplified by the polyoxyalkylene derivatives, amphoteric amino acid dispersing agents, including sulfobetaines and the like. Such wetting agents are disclosed in U.S. Pat. Nos. 2,600,831, issued July 17, 1952; 2,271,622, issued Feb. 3, 1942; 2,271,623, issued Feb. 3, 1942; 2,275,727, issued Mar. 10, 1942; 2,787,604, issued Apr. 2, 1957; 2,816,920, issued Dec. 17, 1957; and 2,739,891, issued Mar. 27, 1956.

The equivalent molecular weights of the polymers of the present invention are subject to wide variation, but typically can be within the range of from about 10,000 to about 500,000. These polymers generally have inherent viscosities within the range of from about 0.10 to about 2.0, preferably from about 0.20 to about 1.4, as measured (unless otherwise indicated in this specification) in a 1:1 (weight) phenol-chlorobenzene mixture (0.25 g polymer in 100 ml) at 25° C. As used herein, the term "inherent viscosity" is determined by the formula:

$$\eta_{inh} = \frac{2.30 \log \eta_{rel}}{C}$$

wherein:

$\eta_{inh}$ is the inherent viscosity;

$\eta_{rel}$ is the relative viscosity of a phenol-chlorobenzene solution of the polymer; and C is the concentration in grams (0.25) of polymer per 100 cc of solution.

The polymers of the present invention typically have glass transition temperatures within the range of about −10° to about 200° C. These temperatures can be determined by differential scanning colorimetry, as disclosed in *Techniques and Methods of Polymer Evaluation*, Volume 2, Marcel Dekker, Inc., New York, 1970.

The polymers of the present invention are soluble in a variety of organic solvents, including acetone, tetrahydrofuran, N,N-dimethylformamide, methyl ethyl ketone and the like. Typically, these solvents are used in the graphic arts to remove unexposed areas of photoresists or lithographic plates. Solubility is defined as for use as developer solvents that the crosslinking of the polymer results in a distinct solubility differential in organic solvents such that said solvents will dissolve uncrosslinked polymer but not crosslinked polymer, and for imaging compositions such as described in U.S. Pat. No. 4,239,848 as 1.9 g of polymer dissolving in 9.6 cc of acetone. The crosslinkable polymers become insoluble after they are crosslinked.

The polymers of the present invention are particularly useful as binders in an imaging system comprising an aromatic dialdehyde capable of reacting with amines to form a dye, a material capable of generating amines in response to activating radiation and a binder that provides improved maximum densities for such an imaging system, such as described in U.S. Pat. No. 4,239,848.

The polymers are compatible with radiation-sensitive compositions and are thus useful as binders for these materials in coating compositions.

The polymers, in order to be useful as photographic binders in applications described in copending U.S. Pat. No. 4,239,848, must be soluble in acetone as other solvents, such as alcohols react detrimentally with the phthalaldehyde and are not sufficiently volatile. The solvents remain in the coatings and increase the efficiency of dye formation, possibly as a result of decreased matrix viscosity. This produces a long-term stability problem. Although the coatings have excellent speeds when fresh, the speed drops upon storage as the solvent continues to evaporate from the layers. Therefore, solvents such as dimethylformamide are too nonvolatile for use. 1,4-Dioxane is too nonvolatile and toxic in addition to a tendency to form explosive peroxides. Cellulosic materials are highly toxic, react with aldehydes and are not volatile enough. The alcohols will react with the aldehydes, especially phthalaldehyde, and therefore are not useful. Ethyl acetate and chlorinated solvents will not dissolve the resulting polymers.

This invention is further illustrated by the following examples, although it will be understood that these examples are included merely for purposes of illustration, and are not intended to limit the scope of the invention.

EXAMPLE 1

Preparation of N-Butyl-4-methacryloyloxybenzenesulfonamide

A solution of 20.91 g (0.20 mol) of methacryloyl chloride in 80 ml of methylene chloride was added to a solution of 45.86 g (0.20 mol) of N-butyl-4-hydroxybenzenesulfonamide, 20.24 g (0.20 mol) of triethylamine and 320 ml of methylene chloride and cooled to 0° C. over a period of approximately 20 minutes. The mixture was then stirred for another 1.5 hours with cooling, washed three times with water, dried over magnesium sulfate and concentrated in vacuo in a warm water bath. The resultant oil (Note 1) was cooled and crystallized to an oily solid. Removal of residual solvent with high vacuum caused this material to completely solidify. This solid was recrystallized from 600 ml of cyclohexane with filtering. Collection of the white solid and drying at room temperature in vacuo gave 38.9 g of N-butyl-4-methacryloyloxybenzenesulfonamide; m.p.=59° to 60° C.

(Note 1: The oil obtained at this degree of purification was found to be sufficiently pure for use in polymerizations. Unless otherwise indicated, this form of the product was employed in the polymer examples.)

Anal. Calc. for $C_{14}H_{19}NO_4S$: C, 56.5; H, 6.4; N, 4.7; S, 10.8. Found: C, 56.1; H, 6.5; N, 4.9, S, 10.6.

EXAMPLE 2

Preparation of N-Phenyl-4-methacryloyloxybenzenesulfonamide

A solution of 3.31 g (0.03169 mol) of methacryloyl chloride in 60 ml of methylene chloride was added to a solution of 7.9 g (0.03169 mol) of N-phenyl-4-hydroxybenzenesulfonamide, 7.06 g (0.0697 mol) of triethylamine and 60 ml of methylene chloride at −5° C. over a period of 15 minutes. The reaction mixture was stirred at reduced temperature for another 2 hours, after which the solution was washed once with 2 percent hydrochloric acid and twice with water. The solution was dried over sodium sulfate, and concentrated in vacuo with warm water bath-heating. The resultant oil crystallized on cooling. This solid was recrystallized from ethanol:water (3:2), collected and dried in vacuo. The yield of N-phenyl-4-methacryloyloxybenzenesulfonamide was 7.05 g; m.p.=101° to 102° C.

Anal. Calc. for $C_{16}H_{15}NO_4S$: C, 60.6; H, 4.8; N, 4.4; S, 10.1. Found: C, 60,7, H, 4.7; N, 4.3; S, 10.4.

EXAMPLE 3

Preparation of N-Methyl-4-methacryloyloxybenzenesulfonamide

To a solution of 15.00 g (0.08 mole) of N-methyl-4-hydroxybenzenesulfonamide, 8.11 g (0.08 mole) of triethylamine and 200 ml of methylene chloride cooled to 0° C. was added a solution of 8.37 g (0.08 mole) of methacryloyl chloride in 100 ml of methylene chloride over a period of approximately 30 minutes. The solution was then stirred for another 3 hours with cooling; washed once with 100 ml of 2 percent HCl solution, and twice with water; dried over magnesium sulfate and concentrated in vacuo in a warm water bath. The resultant solid was recrystallized from 150 ml of ethyl alcohol:water (1:1) with filtering through diatomaceous earth. Collection of the white solid and drying at room temperature in vacuo gave 16.20 g (79.9 percent of theory) of N-methyl-4-methacryloyloxybenzenesulfonamide; m.p.=106° to 107° C.

Anal. Calc. for $C_{11}H_{13}NO_4S$: C, 51.8; H, 5.1; N, 5.5; S, 12.6. Found: C, 51.7; H, 5.5; N, 5.7; S, 12.3.

EXAMPLE 4

Polymerization of N-Butyl-4-methacryloyloxybenzenesulfonamide

A solution of 29.74 g (0.10 mol) of N-butyl-4-methacryloyloxybenzenesulfonamide and 30 ml of dioxane was purged with nitrogen. To this solution was added 0.074 g of 2,2′-azobis(2-methylpropionitrile), and the resulting mixture was heated in a 60° C. bath with nitrogen purge for 16 hours. The resulting highly viscous solution was diluted to 500 ml with dioxane and added to diethyl ether with rapid stirring. The precipitated polymer was collected and dried at room temperature with high vacuum. The yield of polymer was 29.3 g and the inherent viscosity was 0.98.

EXAMPLE 5

Polymerization of N-Phenyl-4-methacryloyloxybenzenesulfonamide

A mixture of 21.5 g of N-phenyl-4-methacryloyloxybenzenesulfonamide and 48.5 g of dioxane was placed in a 125-ml vial with 0.0215 g of 2,2′-azobis(2-methylpropionitrile) and sealed. The mixture was purged with nitrogen for 0.5 hours and then swirled in a 60° C. bath for 96 hours. The resultant solution was poured into diethyl ether to precipitate polymer which was then collected and dried in vacuo at 50° C. The yield of polymer was 14.0 g and the inherent viscosity was 0.73. The glass transition temperature was 132° C.

EXAMPLES 6 THROUGH 13

Polymerization of N-Butyl-4-methacryloyloxybenzenesulfonamide and o-Formylphenyl Vinyl Benzyl Ether A mixture of 54.7 g (0.184 mol) of N-butyl-4-methacryloyloxybenzenesulfonamide, 44.0 g (0.184 mol) of o-formylphenyl vinyl benzyl ether and 400 ml of dioxane was purged with nitrogen. 2,2′-Azobis(2-methylpropionitrile) (0.494 g) was added, and the mixture was heated in a 60° C. bath with a nitrogen sweep for approximately 20 hours. The resultant solution was added to a large volume of diethyl ether to precipitate polymer. The resulting polymer was isolated, rinsed again with ether and dried in a low-temperature vacuum oven. The yield of polymer was 74.0 g and the inherent viscosity was determined to be 0.42. The glass transition temperature was 67° C.

Other copolymers made are listed in Table I, along with their properties.

TABLE I

| Example | Sulfonamide Monomer | Mole Percent | Comonomer | Mole Percent | Polymer I.V. | $T_g$ °C. |
|---|---|---|---|---|---|---|
| Example 7 | N-butyl-4-metha- | 50 | o-formylphenyl | 50 | 0.68 | 29 |

TABLE I-continued

| Example | Sulfonamide Monomer | Mole Percent | Comonomer | Mole Percent | Polymer I.V. | $T_g$ °C. |
|---|---|---|---|---|---|---|
| | cryloyloxybenzene-sulfonamide | | vinylbenzyl ether | | | |
| Example 8 | N-butyl-4-methacryloyloxybenzene-sulfonamide | 50 | o-formylphenyl vinylbenzyl ether | 50 | 1.24 | 85 |
| Example 9 | N-butyl-4-methacryloyloxybenzene-sulfonamide | 67 | o-formylphenyl vinylbenzyl ether | 33 | 1.33 | 23 |
| Example 10 | N-butyl-4-methacryloyloxybenzene-sulfonamide | 50 | m-formylphenyl methacrylate | 50 | 1.34 | 31 |
| Example 11 | N-butyl-4-methacryloyloxybenzene-sulfonamide | 50 | m-formylphenyl methacrylate | 50 | 0.27 | 71 |
| Example 12 | N-butyl-4-methacryloyloxybenzene-sulfonamide | 67 | m-formylphenyl methacrylate | 33 | 1.27 | 19 |
| Example 13 | N-phenyl-4-methacryloyloxybenzene-sulfonamide | 50 | m-formylphenyl methacrylate | 50 | 0.10 | 100 |

Examples 11 and 13 were carried out at 20 weight percent solids based on total reaction solution weight and 0.5 weight percent initiator based on total monomer weight. Examples 7 through 10 and 12 were carried out at 50 weight percent solids and 0.25 weight percent initiator. Recrystallized sulfonamide monomer was used in Example 8.

EXAMPLE 14

Polymerization of N-Methyl-4-methacryloyloxybenzenesulfonamide

A solution of 15.00 g (0.059 mol) of N-methyl-4-methacryloyloxybenzenesulfonamide, 60 ml of N,N-dimethylformamide and 2,2'-azobis(2-methylpropionitrile) (0.075 g) was placed in a 125-ml vial and sealed. The vial was purged with nitrogen for one hour with hypodermic needles and swirled in a 60° C. bath for 18 hours. The resultant solution was poured into diethyl ether to precipitate polymer. The polymer was collected and redissolved in acetone and precipitated again in methylene chloride. The polymer was collected and dried in vacuo at room temperature. The yield of polymer was 14.50 g (96.7 percent conversion), and the inherent viscosity was determined to be 0.81 dl/g.

Anal. Calc. for $C_{11}H_{13}NO_2S$: C, 51.8; H, 5.1; N, 5.5; S, 12.6. Found: C, 51.0; H, 5.7; N, 5.8; S, 11.3.

EXAMPLE 15

Use of Polymer in Radiation-Sensitive Element

This example illustrates one use of the polymers of the present invention.

In 1 g of 2-methoxyethanol were dissolved 23 mg of tris(ethylenediamine) cobalt(III) heptafluorobutyrate plus 20 mg of tris(ethylenediamine) cobalt(III) trifluoromethane sulfonate. A portion (0.4 g) of this solution was added to 3.6 g of a 10 percent solution of poly(N-butyl-4-methacryloyloxybenzenesulfonamide-co-m-formylphenyl methacrylate) (50:50) in acetone. Under red safelights, 8 mg of 4-(2-pyridylazo) resorcinol, an amplifier, and 40 g of 2-(dibenzylamino)-3-methyl-1,4-naphthoquinone, a photoactivator, were added. When dissolved, the resulting solution was coated with a 25-micron doctor blade on a grained, anodized aluminum support. The coating was given an exposure of 600 ergs/cm² at a wavelength of 500 nm, heated (coating side up) for 10 seconds on a 150° C. hot block and swabbed with acetone. A negative polymer image was formed.

EXAMPLES 16 AND 17

Polymer Evaluation

Dopes were prepared according to the formula given below and were coated at about 100 microns wet thickness and subbed poly(ethylene terephthalate) support.

| | |
|---|---|
| Phthalaldehyde | 0.320 g |
| Cobalt(III)hexammine trifluoroacetate | 0.200 g |
| 2-Isopropoxy-1,4-naphthoquinone | 0.0108 g |
| Surfactant | 0.040 g |
| Polymeric binder | 1.90 g |
| Acetone | 7.60 g |

The coating block was set at 90° F. during coating and for one minute thereafter, then heated to 140° F. for five minutes for further drying. The sensitometry of the films was determined from prints preparing by contact exposing the film for about 8 seconds through a 0.3 log E step tablet in an IBM Microcopier IID, Model 9954 exposing apparatus and then developing the image by contacting the back of the film for 5 seconds to a hot block set at 140° C.

The following table lists Examples 16 and 17 evaluated along with the maximum neutral densities of the print. Control polymers A and B are those described in U.S. Pat. No. 2,566,162, are not within the present invention and lack the solubility desirable for application as photographic binders for this system. Control polymer C has the structure:

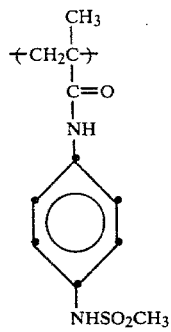

and also lacks the necessary solubility.

TABLE II

| Example | Polymer | $D_{max}$ | Solubility |
|---|---|---|---|
| 14 | N-methyl-4-methacryloyloxy-benzenesulfonamide | 2.05 | soluble |
| 15 | N-butyl-4-methacryloyloxy-benzenesulfonamide | 0.65 | soluble |
| Control A | N-methyl-4-methacrylamido-benzenesulfonamide | — | insoluble |
| Control B | N-butyl-4-methacrylamido-benzenesulfonamide | — | insoluble |
| Control C | N-(4-methacrylamidophenyl)-methanesulfonamide | — | insoluble |

The invention has been described in detail with particular reference to preferred embodiments thereof, but it will be understood that variations and modifications can be effected within the spirit and scope of the invention.

What is claimed is:

1. A compound having the formula:

$$CHR=CR^1-\overset{\overset{O}{\|}}{C}-O-Ar-(CH_2)_q-SO_2NR^2R^3$$

wherein:

R and $R^1$ are independently hydrogen, halide, or alkyl having 1 to 4 carbon atoms;

$R^2$ and $R^3$ are independently hydrogen, alkyl having 1 to 10 carbon atoms, cycloalkyl having 4 to 10 carbon atoms, aryl having 6 to 18 carbon atoms or aralkyl having 7 to 20 carbon atoms;

q is 0 or 1; and

Ar is arylene having 6 to 18 carbon atoms wherein no more than one of $R^2$ and $R^3$ is hydrogen.

2. The compound of claim 1 wherein R and $R^2$ are hydrogen; $R^1$ is hydrogen or methyl; $R^3$ is alkyl having 1 to 10 carbon atoms or aryl having 6 to 18 carbon atoms; and Ar is phenylene.

3. A compound having a formula selected from the group consisting of:

I. $CH_2=\overset{\overset{CH_3}{|}}{C}-\overset{\overset{O}{\|}}{C}-O-\langle\bigcirc\rangle-SO_2NH-C_4H_9$ and II. $CH_2=\overset{\overset{CH_3}{|}}{C}-\overset{\overset{O}{\|}}{C}-O-\langle\bigcirc\rangle-SO_2NH-CH_3$

* * * * *